United States Patent

Schroeder et al.

[11] Patent Number: 5,568,048
[45] Date of Patent: Oct. 22, 1996

[54] THREE SENSOR ROTATIONAL POSITION AND DISPLACEMENT DETECTION APPARATUS WITH COMMON MODE NOISE REJECTION

[75] Inventors: Thaddeus Schroeder, Rochester Hills; Andrzej M. Pawlak, Troy, both of Mich.

[73] Assignee: General Motors Corporation, Detroit, Mich.

[21] Appl. No.: 355,748

[22] Filed: Dec. 14, 1994

[51] Int. Cl.$^6$ .............................. G01B 7/30; G01R 33/09
[52] U.S. Cl. .............................. 324/207.21; 324/207.12; 324/207.25; 324/252
[58] Field of Search ..................... 324/106, 163, 324/165, 166, 173, 174, 207.12, 207.2, 207.21, 207.22, 207.25, 251, 252; 364/424.05; 341/15

[56] References Cited

U.S. PATENT DOCUMENTS

| | | | |
|---|---|---|---|
| 4,262,251 | 4/1981 | Fujishiro et al. | 324/207.25 |
| 4,280,165 | 7/1981 | Pospelov et al. | 324/173 X |
| 4,369,405 | 1/1983 | Sato et al. | 324/174 |
| 4,803,629 | 2/1989 | Noto et al. | 364/424.05 |
| 4,856,607 | 8/1989 | Sueshige et al. | 364/424.01 |
| 4,999,776 | 3/1991 | Soltis et al. | 364/424.05 |
| 5,043,660 | 8/1991 | Hasegawa | 324/207.25 X |
| 5,065,323 | 11/1991 | Shiraishi et al. | 364/424.05 |
| 5,084,674 | 1/1992 | Lachmann et al. | 324/174 |
| 5,089,060 | 2/1992 | Bradley et al. | 148/103 |
| 5,091,021 | 2/1992 | Perry et al. | 148/103 |
| 5,241,267 | 8/1993 | Gleixner et al. | 324/174 X |

FOREIGN PATENT DOCUMENTS

| | | | |
|---|---|---|---|
| 0104262 | 6/1985 | Japan | 324/174 |
| 0148116 | 6/1988 | Japan | 324/207.25 |

OTHER PUBLICATIONS

Podeswa et al; "Differential Hall ICs for Gear Tooth Sensing in Hostile Environments", Sensors Jan. 1989.

*Research Disclosure*, p. 468, Jun. 1992, #33855, "Sensing Steering Position and Rate with Magnetic Speed Variable Assist System" (Disclosed Anonymously).

Primary Examiner—Gerard R. Strecker
Attorney, Agent, or Firm—Michael J. Bridges

[57] ABSTRACT

Position of a rotatable automotive part is sensed with a trio of magnetic field intensity sensors disposed adjacent a ring that rotates with the automotive part, the ring comprising alternating permanent magnet sections with at least one localized magnetic field depression corresponding to a synchronization position of the part wherein the sensors are spaced along the direction of ring rotation so that the relative phase between the output signals of a first pair of the sensors as indicated by the relative output signal magnitude indicates incremental displacement of the part, and so that a significant difference in magnitude between the output signal of a second pair of the sensors indicates the synchronization position.

15 Claims, 2 Drawing Sheets

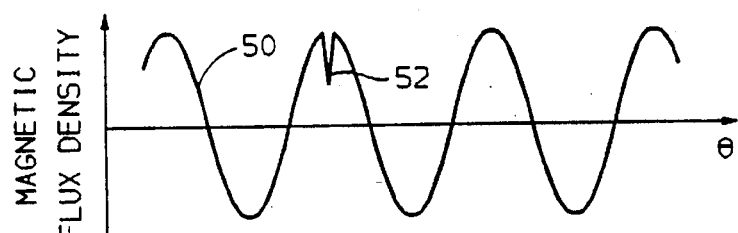
FIG. 3A
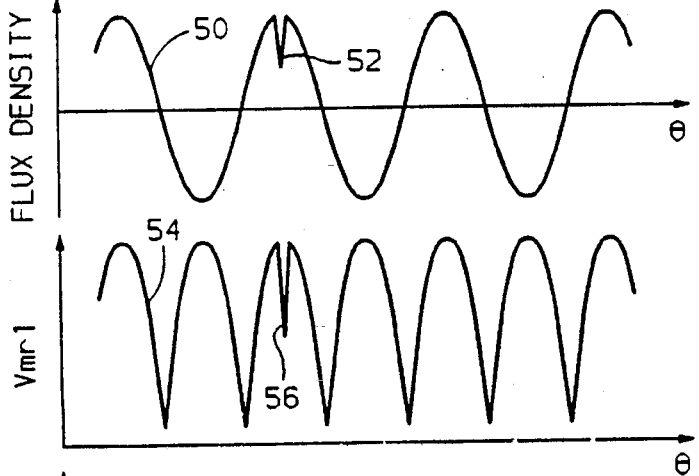
FIG. 3B
FIG. 3C
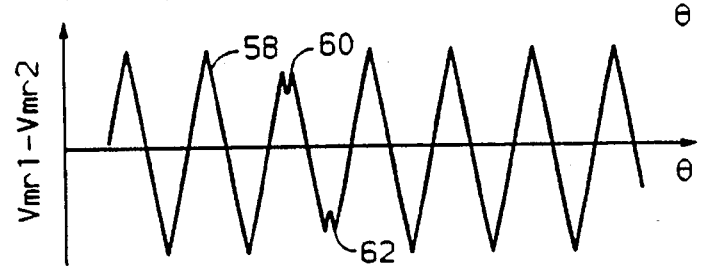
FIG. 3D
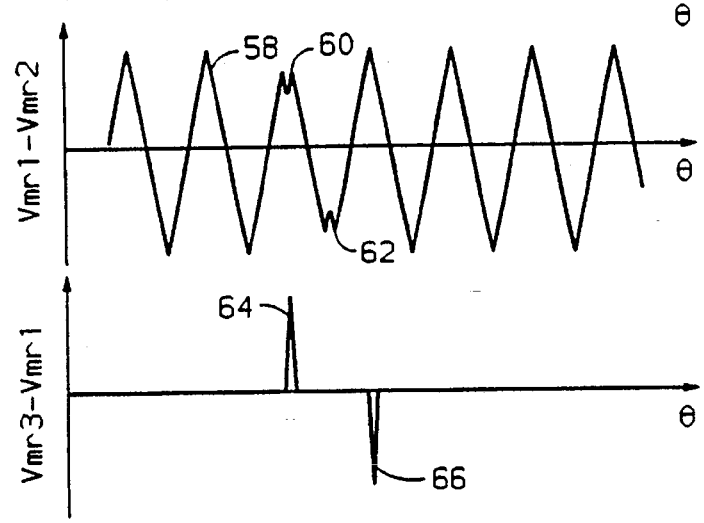
FIG. 4

THREE SENSOR ROTATIONAL POSITION AND DISPLACEMENT DETECTION APPARATUS WITH COMMON MODE NOISE REJECTION

FIELD OF THE INVENTION

This invention relates to angular position detection and, more particularly, to detecting the absolute and relative position of a rotating automotive part.

BACKGROUND OF THE INVENTION

Position sensors for sensing angular displacement of rotating automotive parts, such as toothed wheels and shafts are generally known. Angular displacement is generally recognized as a useful control and diagnostics parameter. Position sensors may be of the conventional hall effect or variable reluctance type, positioned adjacent a rotating automotive part having teeth or notches about its circumference. As the part rotates, the passage of the teeth or notches disturbs the field to which the sensor is exposed. The sensor transduces the field disturbances and outputs a signal interpreted by control or diagnostics hardware as incremental or relative displacement events. Such sensors are typically expensive and are sensitive to field and electrical disturbances.

For automotive applications requiring absolute angular position information, such incremental angular displacement information is not enough. Synchronization information is needed to provide an absolute angular position context within which the incremental displacement information may be interpreted. For example, an absolute position input may be provided when the automotive part is at a known rotational position. A counter of displacement events may be initialized to a value corresponding to the known rotational position upon receiving the absolute position input. The counter may then be updated when displacement events occur and may then be assumed to indicate absolute angular position. Counter initialization may occur periodically, such as following system start-up or following a loss of memory, and counter value verification may occur whenever the absolute position input is received. The approach described in co-pending U.S. patent application Ser. No. 08/249,409, filed May 26, 1994, now U.S. Pat. No. 5,491,632 assigned to the assignee of this application, provides both relative and absolute angular position information. A periodic signal is generated and interpreted through timing circuitry relying on differentiation operations. The timing circuitry is complex and costly, and is sensitive to pulse width variations in the periodic signal, such as may be caused by rapid angular rotation of the measured part. The differentiation operations are edge-sensitive and thus are noise sensitive. The accuracy of this costly and complex prior approach may be reduced due to the above-described sensitivities, especially in applications associated with rapid angular rotation of the measured part, or with significant noise, such as many automotive applications.

SUMMARY OF THE INVENTION

The present invention overcomes the shortcomings of prior relative and absolute angular position sensing approaches through a simple, static, robust position detection approach using multiple matched low-cost sensors applied so that both absolute and relative position information may be derived from common mode sensor signals and so that common mode disturbances such as noise may be rejected.

More specifically, a magnetic ring including sections of alternating magnetic polarity rotates in proportion to rotation of a measured part, such as an automotive shaft or wheel. A pair of sensors for sensing magnetic field intensity variations are positioned so that the ring sections pass the sensors as the ring rotates. A predetermined spacing between the pair of sensors along the direction of rotation of the ring corresponds to a desired phase shift between the output signals of the sensors. The spacing is determined as a function of the pole pitch of the ring sections. The sensors are selected so that they have matching electrical characteristics to improve common mode rejection wherein signal disturbances contemporaneously polluting the sensor signals may be significantly reduced or eliminated, and robust information relating to signal phase shift may be available. The phase shift may be interpreted statically to derive displacement events.

In a further aspect of this invention, an additional matched sensor may be spaced from the pair of sensors along the direction of rotation of the ring according to a spacing determined as a function of the pole pitch of the ring sections. The spacing should be selected so that a distinct, robust absolute position signature may be provided through simple signal processing. Common mode disturbance rejection between the matched third sensor and the pair is provided through a simple comparison of the third sensor output signal and that of at least one of the pair. A simple comparator output signal indicates occurrence of an absolute position event, such as when a localized magnetic field depression on a predetermined ring section passes either the third sensor or one of the pair. Sensitivity to noise is reduced through the common mode rejection so that spurious sensor output signals are not interpreted an the absolute position event.

In yet a further aspect of this invention, sensor drive circuitry for driving the sensors is provided in a matched arrangement in which the sensors share drive circuit components to increase common mode disturbance rejection, providing position information with low sensitivity to drive circuit disturbances.

BRIEF DESCRIPTION OF THE DRAWINGS

The invention may be best understood by referenced to the preferred embodiment and to the drawings in which:

FIGS. 3a–3d illustrate signals produced by the sensors of FIGS. 1 and 2 as the multipole magnetic ring of FIGS. 1 and 2 passes thereby; and FIG. 4 details circuitry for processing the signals of FIGS. 3a–3d to arrive at robust absolute and relative position information of the measured part.

DESCRIPTION OF THE PREFERRED EMBODIMENT

Figure 1:
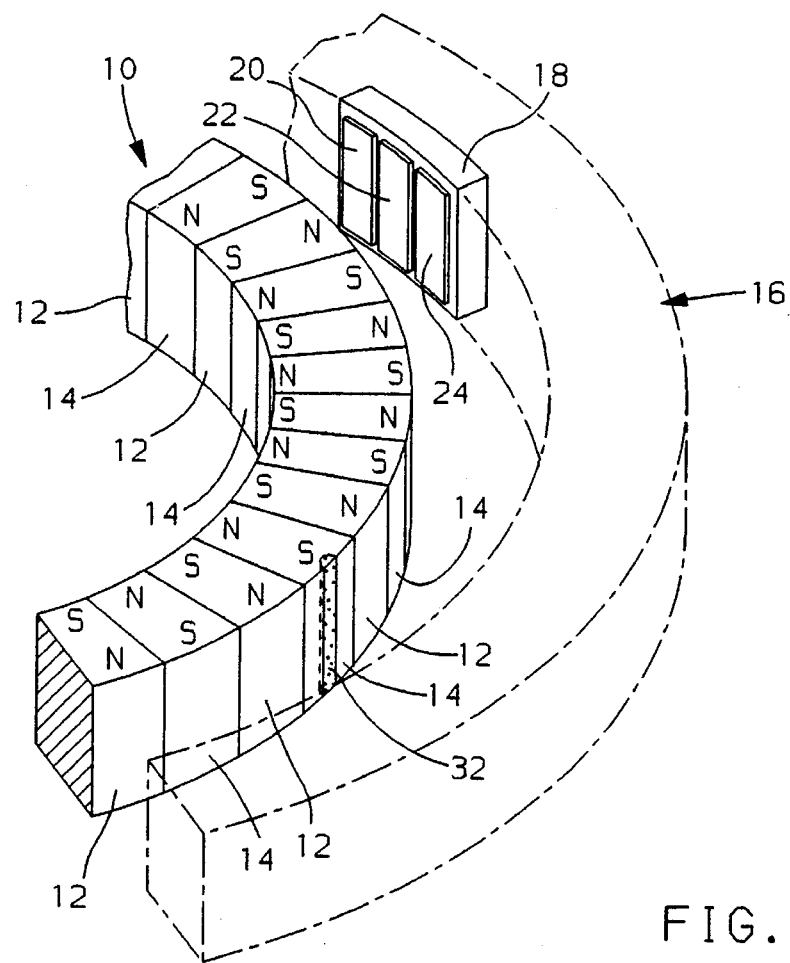
FIG. 1 is a diagram of a multipole magnetic ring including sections of alternating magnetic polarity that rotates in proportion to rotation of the measured part, and a sensor assembly that is substantially stationary relative to the ring for measuring relative and absolute angular position of the ring in accord with the preferred embodiment.

Referring to FIG. 1, a multipole magnetic ring 10 includes adjacent permanent magnet sections 12 and 14 of alternating magnetic polarity. The multipole magnetic ring rotates with an automotive part (not shown) the rotational displacement and absolute rotational position of which is to be measured. The automotive part may be a shaft that rotates with an automotive vehicle steering wheel. The multipole magnetic ring is mechanically linked to the automotive part so that as the automotive part rotates, the multipole magnetic ring rotates by a proportional amount. Each of the permanent magnet sections 12 and 14 is magnetically encoded with opposite magnetic polarity at opposing section ends. Each section is oriented so that the opposing ends thereof lie along the radius of the multipole magnetic ring formed thereby. Adjacent sections are configured to have reverse magnetic polarity with neighboring sections so that adjacent sections magnetically attract each other and so that along both the inner and outer ring perimeter, a pattern of alternating S and N poles is provided. Accordingly, the polarity of the magnetic field along both the inner and outer ring circumference varies cyclicly. The size of the permanent magnet sections is substantially matched, providing a substantially common pole pitch, which is the arc length of a complete magnetic cycle along either the inner or outer perimeter of the multipole magnetic ring.

To provide for absolute position detection, a localized depression in the magnetic field strength of a predetermined permanent magnet section of the ring is provided. For example, a magnetic notch may be created in the section through localized heating of a portion of the section by a laser, such as disclosed in U.S. Pat. Nos. 5,089,060, 5,091,021, and 5,283,130. Alternatively, a conventional magnetizer device may be used to apply a field of reverse magnetic polarity to a portion of the section to weaken the magnetic field strength of the portion and thus form the notch.

Sensors 20, 22, and 24 are positioned adjacent the multipole magnetic ring 10, and are fixed in angular position relative to the rotating ring and sufficiently close to the permanent magnet sections of the ring to be exposed to the magnetic field created by the sections thereof. In this embodiment, the sensors are disposed on a housing 16 adjacent yet not contacting the outer perimeter of the multipole magnetic ring 10. Further in this embodiment, the sensors 20, 22, and 24 are conventional magnetoresistive (MR) sensors generally understood to have an electrical resistance across the sensor which varies as a function of the magnetic field strength to which the MR sensor is exposed. The MR sensors, in this embodiment, are disposed on a soft iron plate or strip 18 serving as a magnetic field concentrator. Alternatively, the sensors may be disposed on an N pole of a biasing permanent magnet, wherein the N pole of the biasing magnet and the MR sensors face the outer perimeter of the multipole magnetic ring. Accordingly, the magnetic field strength to which an individual one of the MR sensors is exposed is at a maximum when an N or S pole of a multipole magnetic ring section is directly in front the MR sensor and is at a minimum when a boundary between the N and S poles of the multipole magnetic ring is directly in front of the sensor. The conventional MR sensor of the preferred embodiment is characterized by a proportionate relationship between electrical resistance across the MR sensor and magnetic field strength to which the MR sensor is exposed. Accordingly, the electrical resistance of any of the sensors is at a maximum when an N or S pole of the multipole magnetic ring is directly in front of the sensor and is at a minimum when a boundary between the N and S poles of the multipole magnetic ring section is directly in front of the MR sensor.

The sensing elements 20, 22, and 24 are positioned along the direction of rotation of the multipole magnetic ring and are spaced in accord with a predetermined function of the pole pitch of the ring sections. In this embodiment, the magnetic notch should be directly over a predetermined one of the sensing elements 20 or 24 when the automotive part that is being measured in at a predetermined angular position. For example, in the automotive steering wheel sensing application of this invention, the predetermined angular position is a steering wheel angle at which the automotive vehicle is being directed to proceed in a substantially straight path. Accordingly as will be described, an absolute position signal will be provided in this embodiment when the vehicle is being directed to proceed along such straight path.

Figure 2:
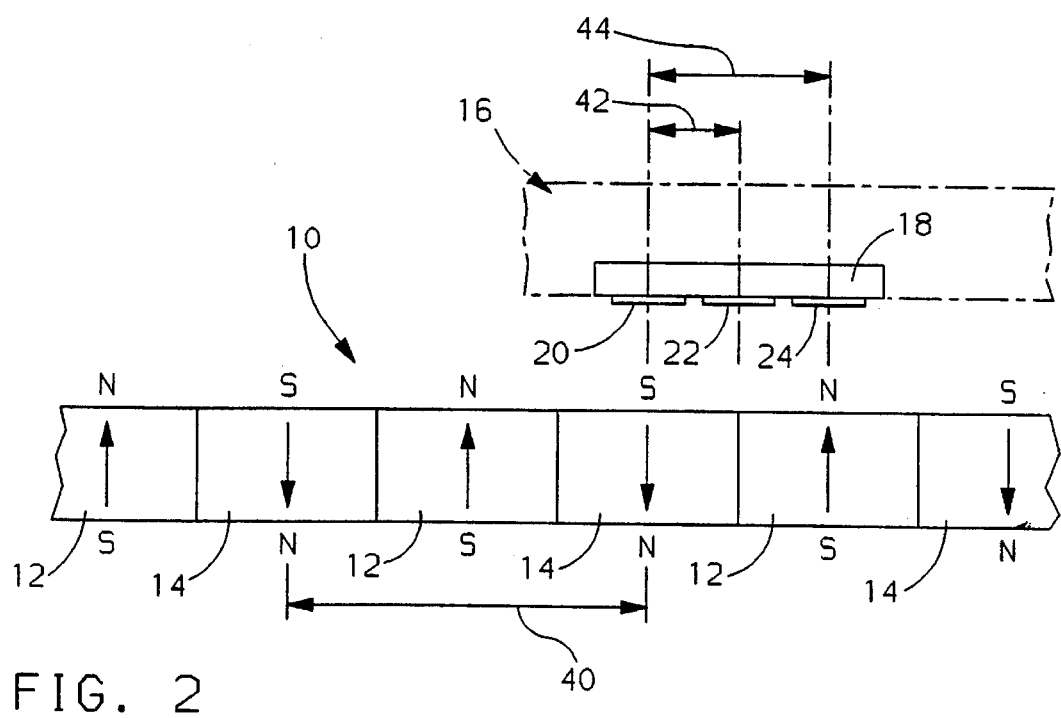
FIG. 2 schematically illustrates the multipole magnetic ring and the sensor assembly of FIG. 1.

The schematic diagram of FIG. 2 details the pole pitch PP 40 of the multipole magnetic ring 10 over which a complete cycle of magnetic polarity between sections 12 and 14 is traversed. The spacing 42 between the sensors 20 and 22 mounted on a soft iron plate or strip 18 which is disposed on housing 16 is a predetermined function of PP 40, such as PP/4 in this embodiment. Likewise the spacing 42 may be set as NPP/2+ PP/4, in which N is an integer. The spacing 44 between sensors 20 and 24 mounted on the soft iron plate 18 which is disposed on housing 16 is likewise a predetermined function of PP 40, such as PP/2 in this embodiment. Likewise, the spacing 44 may be set as NPP/2 in which N is an integer.

Representative sensor signal values under the sensor configuration of FIGS. 1 and 2 are illustrated in FIGS. 3a–3d. Signal 50 of FIG. 3a details the variation in magnetic flux density to which an MR sensor is exposed as the multipole magnetic ring 10 rotates. Magnetic field strength and thus magnetic flux density are at a maximum indicated by the positive peaks of signal 50 when the MR sensor is directly in front of an N or S pole of a section 14 of the multipole magnetic ring 10, and are at a minimum indicated by the zero crossings of signal 50 when the MR sensor is directly in front of a boundary between adjacent N and S poles. A sharp disturbance in the substantially sinusoidal variation in magnetic flux density illustrated by the portion 52 of curve illustrates a typical magnetic flux density disturbance caused by passage of the magnetic notch 32 (FIG. 1) by the MR sensor.

Each of the matched sensors 20, 22, and 24 is exposed to substantially the same variation in magnetic flux density illustrated by curve 50 with disturbance portion 52 as the multipole magnetic ring rotates. The spacing between the matched MR sensors is used to yield absolute and relative position information in accord with this invention. A constant, current source may be applied to the MR sensors and the voltage drop across the sensors measured as an indication of electrical resistance variations in the sensors. The manner of indicating such variations in accord with the present embodiment will be detailed in FIG. 4. Signal 54 of FIG. 3b details the variation in electrical potential Vmr1 across MR sensor 20 having a constant current source applied thereto in the presence of the variations in magnetic flux density of FIG. 3a. The MR sensor is sensitive to magnetic field strength and not to magnetic field polarity as indicated by signal Vmr1 corresponding to the signal 50 of FIG. 3a, having twice the frequency of the magnetic field generated by the multipole magnetic ring 10 to which the MR sensor 20 is exposed.

The electrical potential Vmr2 across MR sensor 22 (FIGS. 1 and 2) having electrical characteristics substantially matching those of the sensor 20 and spaced a distance NPP/2+ PP/4 away from such sensor, in which N is an integer and PP is the multipole magnetic ring pole pitch, will match the potential Vmr1 54 of FIG. 3b but will be 180 magnetic degrees out of phase with Vmr1. Common mode disturbance rejection is provided by combining the two signals, such as by subtracting Vmr2 from Vmr1, which will result in a difference signal 58 of FIG. 3*c*. The frequency of signal 58 is equal to twice the frequency of the magnetic field to which the MR sensors 20 and 22 are exposed. Simple edge insensitive circuitry may be provided for comparison of the two signals yielding robust relative position information, as will be detailed in FIG. 4. Passage of the magnetic notch 32 of FIG. 1 by the two sensors 20 and 22 (FIGS. 1 and 2) is indicated by respective signal disturbances 60 and 62 of FIG. 3*c*.

Electrical potential Vmr3 across MR sensor 24 having electrical characteristics substantially matching those of the sensor 20 and spaced away from such sensor by a spacing NPP/2 in which N is an integer and PP is the multipole magnetic ring pole pitch, will substantially match the electrical potential Vmr1 (FIG. 3*b*) and will have the same magnetic phase as such signal, as it will be a multiple of 360 degrees out of phase with such signal. Common mode disturbance rejection is provided by comparing such signals, such as by subtracting Vmr1 from Vmr3, to yield the difference signal of FIG. 3*d*, having substantially zero magnitude except when sensor 20 or sensor 24 passes by the magnetic notch 32 (FIG. 1). For example, when sensor 20 passes by the magnetic notch, a transient electrical potential depression occurs across sensor 20 but not across sensor 24, and the positive transient 64 results. Alternatively, when sensor 24 passes by the magnetic notch 32, the negative transient 66 results. Simple, edge insensitive circuitry may be provided, as illustrated in FIG. 4, for sensing occurrence of one or the other transients of FIG. 3d as an indication of passage of the magnetic notch 2 by sensor 20 or sensor 24.

Turning to FIG. 4, a simple edge-insensitive circuit is provided for analysis of MR sensor output signals. A constant current supply is provided to MR sensors 20, 22 and 24 using a source voltage Vs, such as twelve volts, applied to anode of conventional current regulating diodes D1, D2 and D3 to provide a substantially constant current source to the MR sensors. Any conventional, substantially constant current source may be applied to the MR sensors in accord with this invention, such as an integrated matched trio of current sources capable of providing up to about ten milliamps of substantially constant current to the MR sensors. In this embodiment, Motorola Part no. IN5314 is the current regulating diode used for diodes D1, D2 and D3 of FIG. 4. The cathode of diodes D1, D2 and D3 are electrically connected to a high side of respective MR sensors 20, 22, and 24. The low side of the MR sensors is tied to a ground reference. Conventional op-amps 80 and 82 are provided in comparator configuration for comparison of the voltage across the MR sensors. National Semiconductor quad comparator LM139 with fifty millivolt hysteresis may be used in accord with this embodiment. However, any of a variety of comparators as are generally known in the art may be substituted therefor. Indeed, an integrated package including two comparators and a trio of current sources may be used in accord with this invention for driving the MR sensors and for comparing MR sensor output signals in accord with this invention.

The voltage across the MR sensor 20, at the node between the sensor 20 and the cathode of diode D1, is passed through series resistor R3 of about twenty kilohms and applied to the non-inverting input of comparator 80, and is passed through series resistor R2 also of about twenty kilohms and applied to the inverting input of comparator 82. The voltage across the MR sensor 22, at the node between the sensor 22 and the cathode of D2, is passed through series resistor R4 of about twenty kilohms and then is applied to the inverting input of comparator 80. The voltage across the MR sensor 24, at the node between the sensor 24 and the cathode of D3, is passed through input resistor R1 of about twenty kilohms and applied to the non-inverting input of comparator 82. Comparators 80 and 82 have feedback resistors R8 and R5, respectively, each of about 1 Megohm. The output line of each comparator is pulled up to the source voltage Vs via pull-up resistors R9 and R6, respectively, each resistor of about three kilohms. The output lines are pulled down to the ground reference via resistors R10 and R7, respectively. Comparator 80 output signal Pr provides relative position information, and comparator 82 output signal Pa provides absolute position information, as will be described.

Functionally, comparator 80 is configured to output a high signal whenever Vmr1, which is the voltage across MR sensor 20, exceeds Vmr2, which is the voltage across MR sensor 22. Otherwise the comparator 80 output will be low. The spacing between sensors 20 and 22, illustrated in FIG. 2, provides for a phase shift of 180 electrical degrees between the otherwise matched signals Vmr1 and Vmr2, each characterized by a frequency twice that of the magnetic field generated by the multipole magnetic ring passing by the sensors 20 and 22. Therefore, the magnitude of Vmr1 will exceed the magnitude of Vmr2 for half of each cycle of the periodic signals Vmr1 and Vmr2. FIG. 3*c* illustrates the relative magnitude of Vmr1 and Vmr2. Comparator 80 output will therefore be driven high once for each passage of a permanent magnet section by the sensor 20, or equivalently, for each passage of a section by the sensor 22.

Turning to comparator 82 for indicating absolute position information, the comparator output signal Pa on line 70 will be high when the voltage Vmr3 across MR sensor 24 exceeds the voltage Vmr1 across MR sensor 20. As the signals Vmr1 and Vmr3 are 360 degrees out of phase (or some multiple of 360 degrees out of phase), and are otherwise matched, Vmr3 will only exceed Vmr1 when the magnetic notch 32 (FIG. 1) is encountered by the sensor 20, reducing the magnetic flux density sensed by sensor 20, and therefore reducing the voltage across the sensor Vmr1. FIGS. 3*a*, 3*b* and 3*d* illustrate the reducing in flux density and in Vmr1 resulting from passage of the magnetic notch 32 by sensor 20. Signal 64 of FIG. 3d illustrates the transient increase in the difference between Vmr3 and Vmr1 when the notch is encountered by MR sensor 20. While the transient increase is present, comparator 82 output signal Pa will be high, indicating the absolute position event.

The comparator output signals on lines 70 and 72 may be provided to input ports of a conventional controller 100, such as a single chip microcontroller, for interpretation. Alternatively, the signals may be applied to a conventional timer processor unit TPU or other device capable of sensing and processing input signal events. The controller 100 or other device may be configured to respond to a predetermined input event, such as a rising or falling edge or to a high level, by generating an interrupt and vectoring the controller 100 attention to interrupt service operations to update a count of displacement events, and to synchronize the count of displacement events when absolute position information is received.

The displacement event count may be interpreted to provide actual angular position of the measured automotive part applying a predetermined gain factor to the count. The gain factor should be expressed in units of degrees of measured automotive part rotational displacement per multipole magnetic ring section. The absolute position event, then received, may trigger operations to verify that the count of displacement events is at a baseline value corresponding to a baseline position of the automotive part at which the magnetic notch 32 (FIG. 1) is positioned in front of the MR sensor 20, as described. If the count is not at the baseline value, it may be corrected to the baseline value and a displacement count fault condition may be stored or indicated and, if stored, used subsequently for a permanent offset value.

The preferred embodiment for the purpose of explaining this invention is not to be taken as limiting or restricting this invention since many modifications may be made through the exercise of skill in the art without departing from the scope of the invention.

The embodiments of the invention in which a property or privilege is claimed are described as follows:

1. A sensing apparatus for sensing absolute angular position and angular displacement of a rotating automotive part, comprising:

a multipole magnetic ring mechanically linked to the automotive part so as to rotate in proportion to automotive part rotation, the multipole magnetic ring including a set of adjacent permanent magnet sections of alternating magnetic polarity having a substantially common pole pitch, wherein a portion of a predetermined permanent magnet section of the multipole magnetic ring is characterized by a significant variation in magnetic field intensity;

a pair of matched sensors for outputting signals indicating magnetic field intensity, the pair positioned adjacent the multipole magnetic ring and spaced along the direction of rotation of the multipole magnetic ring by a spacing that is a predetermined function of the substantially common pole pitch;

a third matched sensor for outputting a signal indicating magnetic field intensity, the third sensor positioned adjacent the multipole magnetic ring and spaced from a predetermined one of the pair of matched sensors along the direction of rotation of the multipole magnetic ring by a third sensor spacing that is a predetermined function of the substantially common pole pitch, the third sensor spacing providing that the magnetic field intensity at the third sensor will be significantly different than the magnetic field intensity at the predetermined one of the pair when the predetermined permanent magnetic section passes by the third matched sensor and when the predetermined permanent section passes by the predetermined one of the pair;

circuitry for detecting a significant deviation between the output signal of the third matched sensor and the output signal of the predetermined one of the pair of matched sensors and sensing an absolute angular position of the automotive part when the significant deviation is detected;

comparator circuitry for detecting a predetermined change in the relative magnitude of the output signals of the pair of matched sensors and for providing a comparator output signal indicating the detected predetermined change; and circuitry electrically connected and responsive to the comparator output signal for detecting a displacement of the automotive part when the predetermined change in the relative magnitude is detected.

2. The sensing apparatus of claim 1, wherein the pair of matched sensors and the third matched sensor are magnetoresistors.

3. The sensing apparatus of claim 1, further comprising sensor drive circuitry for applying a matched sensor drive signal to the pair of matched sensors and to the third matched sensor.

4. The sensing apparatus of claim 3, wherein the sensor drive circuitry comprises a single drive circuit for driving the pair of matched sensors and the third matched sensor.

5. The sensing apparatus of claim 1, wherein the predetermined function is approximately $$N * PP/2 + PP/4$$

in which N is a predetermined integer and PP is the substantially common pole pitch.

6. The sensing apparatus of claim 1, wherein the third sensor spacing is approximately $$N * PP/2$$

in which N is a predetermined integer and PP is the substantially common pole pitch.

7. The sensing apparatus of claim 1, wherein the rotating automotive part is an automotive steering wheel shaft that rotates with an automotive vehicle steering wheel.

8. An apparatus for detecting rotational position of a rotatable automotive part by sensing an absolute position of the part and displacement of the part away from the absolute position, comprising:

a multipole magnetic ring mechanically associated with the automotive part to rotate with the automotive part, and having a set of adjacent permanent magnet sections of alternating magnetic polarity and of a substantially uniform pole pitch;

a predetermined one of the set of permanent magnet sections having a magnetic notch characterized by a significant localized variation in magnetic field intensity;

a trio of sensors having substantially matching electrical characteristics for outputting signals indicating magnetic field intensity, the trio disposed adjacent the multipole magnetic ring, wherein a spacing between a first predetermined pair of the trio along the direction of rotation of the ring is a predetermined function of the substantially uniform pole pitch and a spacing between a second predetermined pair of the trio along the direction of rotation of the ring is established so that magnetic field intensity is significantly different at each of the second predetermined pair when the magnetic notch passes by either of the second predetermined pair;

a comparator for receiving output signals from the first predetermined pair and for outputting a displacement signal indicating the relative magnitude of the received output signals;

a comparator for receiving output signals from the second predetermined pair and for outputting an absolute position signal indicating the relative magnitude of the output signals received thereby; and control hardware for receiving the displacement and absolute position signals and for interpreting the displacement and absolute position signals to indicate displacement of and absolute position of the automotive part.

9. The apparatus of claim 8, wherein the control hardware detects a predetermined initialization position of the automotive part when a predetermined state change occurs in the absolute position signal.

10. The apparatus of claim 8, wherein the control hardware detects a predetermined angular displacement of the automotive part upon detecting a predetermined state change in the displacement signal.

11. The apparatus of claim 8, wherein the control hardware detects a predetermined initialization position when a predetermined state change occurs in the absolute position signal, and detects a predetermined angular displacement away from the initialization position when a predetermined state change occurs in the displacement signal.

12. The apparatus of claim 8, wherein the spacing between the first predetermined pair of the trio is $$N * PP/2 + PP/4$$

in which N is an integer and PP is the substantially uniform pole pitch.

13. The apparatus of claim 8, wherein the spacing between the second predetermined pair of the trio is $$N * PP/2$$

in which N is an integer and PP is the substantially uniform pole pitch.

14. The apparatus of claim 8, wherein the trio of sensors are magnetoresistors.

15. The apparatus of claim 8, further comprising a drive circuit for driving the trio of sensors with a common drive signal.

* * * * *